United States Patent [19]

Baudry

[11] Patent Number: 4,618,590

[45] Date of Patent: Oct. 21, 1986

[54] STARTING MIXTURE FOR A DIELECTRIC COMPOSITION

[75] Inventor: Hugues Baudry, Varennes-Jarcy, France

[73] Assignee: U.S. Philips Corporation, New York, N.Y.

[21] Appl. No.: 730,220

[22] Filed: May 3, 1985

[30] Foreign Application Priority Data

May 18, 1984 [FR] France ................. 84 07769

[51] Int. Cl.⁴ .............. C03C 14/00; C03C 8/14; C03C 8/04
[52] U.S. Cl. .................... 501/17; 501/26; 501/32; 501/65; 501/67; 501/69; 501/73; 501/79
[58] Field of Search .............. 501/17, 26, 32, 65, 501/67, 69, 73, 79

[56] References Cited

U.S. PATENT DOCUMENTS 4,323,652  4/1982  Baudry et al. ............. 501/17

Primary Examiner—Mark L. Bell
Attorney, Agent, or Firm—Norman N. Spain

[57] ABSTRACT

The invention relates to the formulation of a starting mixture for an insulating composition, comprising a vitreous phase and several ceramic phases in the respective ratios by volume for the vitreous phase between 85 and 60% and for the ceramic phases between 15 and 40%, the vitreous phase being a silicate of zinc and alkaline earth.

According to an embodiment of the invention the starting mixture is remarkable in that the vitreous phase is constituted by the molar ratios of the following oxides: 30 to 55% of silicon ($SiO_2$), 15 to 30% of zinc oxide (ZnO), 0 to 20% of boric anhydride ($B_2O_3$), 0 to 10% of alumina ($Al_2O_3$), 15 to 40% of barium oxide (BaO), and in that the ceramic phases are constituted by the ratios by volume of the following oxides: 0 to 10% of cobalt oxide ($Co_3O_4$), 5 to 20% of zinc oxide (ZnO), and 10 to 25% of lead oxide ($PbO_2$).

Application: Manufacture of microcircuits on colaminated metallic substrates.

4 Claims, 4 Drawing Figures

STARTING MIXTURE FOR A DIELECTRIC COMPOSITION

BACKGROUND OF THE INVENTION

The invention relates to the formulation of a starting mixture for a dielectric composition, comprising a vitreous phase and several ceramic phases in the respective ratios by volume for the vitreous phase between 85 and 60% and for the ceramic phases between 15 and 40%, the vitreous phase being a silicate of zinc and alkaline earth.

The invention is is useful in the manufacture of power microcircuits or a support of a large surface area for components in the field of integrated circuits.

It is known from the article by J. P. DELLA MUSSIA in "Electronique actualités" of Mar. 9, 1984, p. 15, entitled "Les télécommunications étrangéres homologuent les co-laminés d'Imphy" to substitute on the conventional ceramic substrate which constitutes the support of the assembly of the integrated circuits a new conductive laminate, covered by an electrically insulating layer.

This laminate is constituted by a substrate of an alloy of the INVAR type (nickel-iron alloy containing 36% of nickel), each of the surfaces of which is provided with a copper plating thus forming a succession of three layers, copper, invar, copper. The laminate has a coefficient of expansion which is adjustable during its manufacture due to the fact that this coefficient depends on the relative thickness of the three layers.

A laminate in which the triplet Cu/INVAR/Cu has the thickness percentages 16/68/16, has a number of advantages. Among these advantages are:
- a coefficient of expansion, parallel to the surface, very near that of alumina and various semiconductors, between 0° and 300° C.,
- a thermal conductivity, parallel to the surface, approximately seven times greater than that of alumina. (While the thermal conductivity perpendicularly to the surface is of the same order of magnitude as that of alumina). An essential function of this laminate thus is to serve as a radiator for the circuits which are disposed thereon.
- the possibility of providing substrates of large dimensions, which is not the case with alumina;
- the possibility of providing substrates as thin as the substrates of alumina, for example 35 μm,
- the possibility of soldering on the rear side a supplementary layer of copper in order to improve the radiation properties,
- the resistance to shocks and
- the possibility of mechanical or chemical piercing, folding, stamping or cutting.

Another laminate of the triplet Cu/Invar/Cu 16/68/16, in which the inner layer has a corrugated form, possesses enhanced refrigerating properies due to internal circulation. It presents, due to this fact, an extra advantage, and may serve as a substrate for circuits intended, for example, for military applications, having to satisfy the standards 55° C.-+125°C.

However these laminates have the following disadvantages:
They are not electrically insulating at the surface.
Oxides are formed at the surfaces if they are not protected.

From these advantages and disadvantages it follows that the laminates have been provided originally to serve as a support and radiator for ceramic substrate the so called "chip carrier" of integrated circuits or for power components or components of large dimensions, due to the compatibility of the coefficients of expansion of the laminate and of these elements forming at the surface of the laminate an electrically insulating layer on which the circuit of these elements is formed.

It is known, as described in the above-mentioned article to manufacture the insulating layer and the circuit by means of polymerisable organic materials.

However, this process has several disadvantages among which are:
- the poor temperature behaviour of such materials, the polymerization temperature being of the order of 250° C.;
- the poor mechanical rigidity of the polymerisable materials, which does not permit taking advantage of the great rigidity of the substrate;
- the bad electrical conductivity of the conductive layers which, being polymers charged with silver, show the following:

$R \simeq 30 m\Omega/\square$;

- the fact that said conductors cannot be soldered;
- the lack of resolution of the realized conductors, which does not permit of devising circuits of high integration density;

On the contrary a conductive silk-screening ink such as that described in GB-PS 1,489,031 presents several advantages which include:
- the possibility of withstanding high temperatures;
- a high mechanical rigidity;
- the resolution of conductors permitting of obtaining circuits with high integration density and
- the very good electrical conductivity of said layer of which the resistance is:

$R \simeq 2 m\Omega/\square$

However such a conductive silk-screening ink cannot be used directly on the laminated substrate. An insulating layer which is also perfectly adapted to the laminate and to the conductive ink is preferably provided between said latter and the first conductive layer.

Thus following the technical problem is present: In order to profit by the advantages presented by the new laminated substrate while forming thereon circuits by means of a conductive silk-screening ink as has been described it is desirable to provide an insulating silk-screening ink. ($\epsilon$ as low as possible) and which has:
- A high firing temperature thereby being able to withstand the refiring of the envisaged conductive layer(s);
- a coefficient of expansion near that of the laminate not only in the range of temperatures between 0° and 300° but also for temperatures between 300° and the firing temperature of the ink;
- a good adherence to the laminate and
- finally the possibility of being fired under a non-oxidizing atmosphere so as to avoid oxidation of the laminate.

A starting mixture for an insulating composition for use in an insulating silk-screening ink of high firing temperature under nitrogen is known from U.S. Pat. No. 4,323,652. According to this patent this mixture comprises a vitreous phase constituted by the molar ratios of the following oxides: from 30 to 55% of silicon ($SiO_2$), from 20 to 40% of zinc oxide (ZnO), from 0 to 20% of boric anhydride ($B_2O_3$), from 0 to 10% of alumina, from 5 to 40% of calcium anhydride (CaO), strontium oxide (SrO) and barium oxide (BaO), as well as optionally from 0 to 10% of cobalt oxide (CoO) as a dye. Said mixture comprises also several ceramic phases such as zinc oxide and cobalt oxide.

According to this patent by use of such a mixture in the ratios by volume between 85 and 60% for the vitreous phase and between 15 and 40% for the ceramic phases dispersed in an organic carrier, an insulating silk-screening ink may be obtained which is capable of being fired in a high temperature in nitrogen and compatible with the conductive ink as described. However, this ink is suitable only for the manufacture of hybrid microcircuits on ceramic substrates and always leads to a deformation of the substrate when it is used on the laminate.

In effect, in order to adapt said ink to the laminate substrate, all possible tests of variation of the ratios of the constituents of the ink suggested by the above-cited patent have been made. None of these ratios have proven to be successful.

For, of all the difficulties encountered by developing such an ink, the most complicated one to solve is the adaptation of the temperature coefficient of the ink to that of the laminate. At any rate the solution to the technical problem described is not found in the use of an ink mnufactured according to the above-mentioned patent.

SUMMARY OF THE INVENTION

It is therefore an object of the present invention to provide a new starting mixture for an electrically insulating composition such as defined in the opening paragraph which is characterized in that the ceramic phases include zinc oxide (ZnO), cobalt oxide ($Co_3O_4$) and lead dioxide ($PbO_2$).

By use of these ceramic phases the ink manufactured by dispersing such a composition in an organic carrier, allows the technological problem to be solved and in particular presents a coefficient of expansion which is well adapted to the laminate substrate chosen.

More particularly according to the invention the starting mixture is characterized in that the vitreous phase is constituted by the following molar ratios 30 to 55% of silicon dioxide ($SiO_2$), 15 to 30% of zinc oxide (ZnO), 0 to 20% of boric oxide anhydride ($B_2O_3$), 0 to 10% of alumina ($Al_2O_3$), 15 to 40% of barium oxide (BaO), and in that the ceramic phases are constituted by the volume ratios: 0 to 10% of cobalt oxide ($Co_3O_4$), 5 to 20% of zinc oxide (ZnO), and 10 to 25% of lead dioxide ($PbO_2$).

DETAILED DESCRIPTION OF THE INVENTION

According to a preferred embodiment the starting mixture is characterized in that the molar ratios of the mixture is characterized in that the molar ratios of the vitreous phase are chosen to be equal to 45% of silicon dioxide ($SiO_2$), 20% of zinc oxide (ZnO), 5% of boric anhydride ($B_2O_3$) 5% of alumina ($Al_2O_3$), 25% of barium oxide (BaO).

Also according to a preferred embodiment the starting mixture is characterized in that it comprises in ratios by volume 68% the constituent forming the vitreous phase, associated with a ceramic phase of zinc oxide (ZnO) in the ratio by volume of 11%, a ceramic phase of cobalt oxide ($Co_3O_4$) in the ratio by volume of 2% and a ceramic phase of lead dioxide ($PbO_2$) in the ratios by volume of 19%.

The silk-screening ink obtained starting from said composition has a high softening temperature which permits the ultimate deposition of high temperature conductive inks. The coefficient of expansion of said insulating silk-screening ink is extremely close to the coefficient of expansion of the described colaminate 16/68/16, even up to temperatures near the solidification temperature of the ink. On the other hand this ink permits a firing under nitrogen which avoids the oxidation of the laminate. Finally the layers manufactured by means of said ink present a perfect coherence with the surface of the laminate, a large flatness and a large delicacy permitting the ultimate deposition of conductive layers of high definition.

Figure 1:
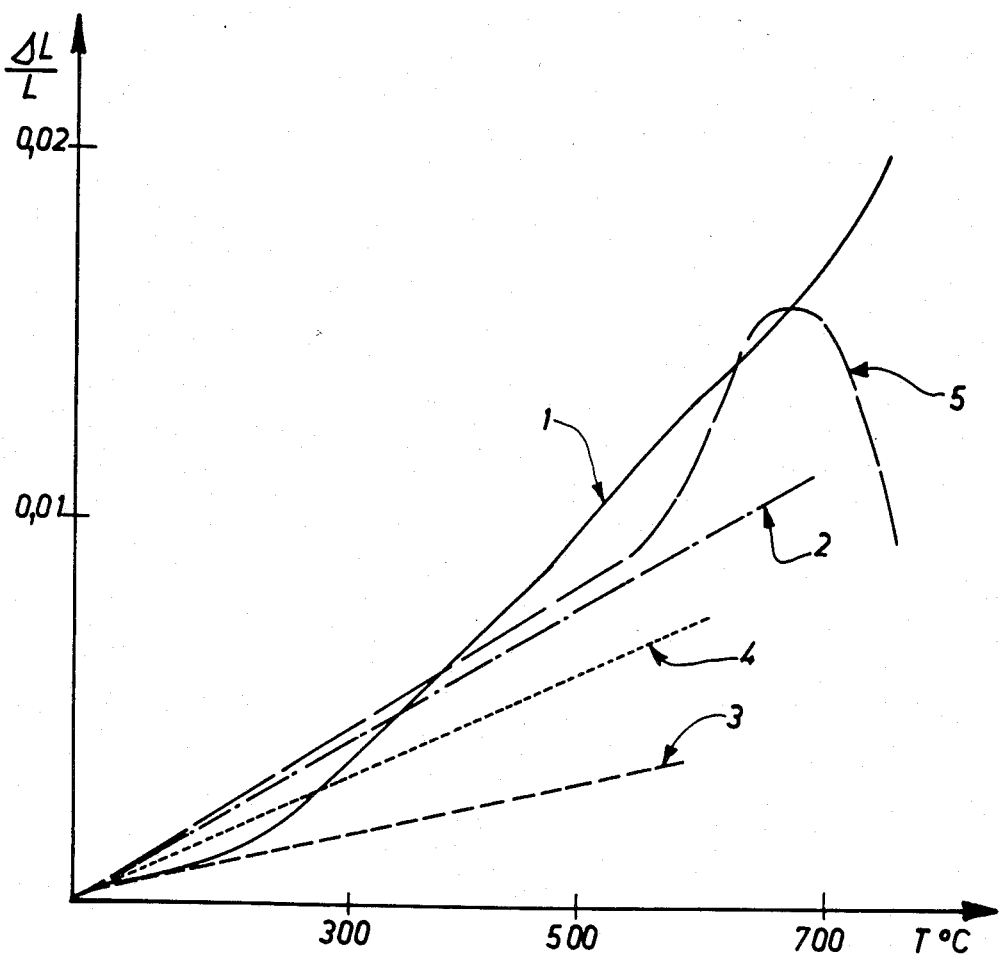
FIG. 1 is a graph showing the relative elongation as a function of temperature of a number of materials including an insulating composition of the invention.

The invention will now be described in greater detail, by way of example, with reference to the accompanying drawings, in which FIG. 1 is a graph showing relative elongations, as a function of temperature, of the laminate (1), of alumina (2) of silicon dioxide (3), of gallium arsenide (4), and of the insulator of the invention (5).

Figure 2:
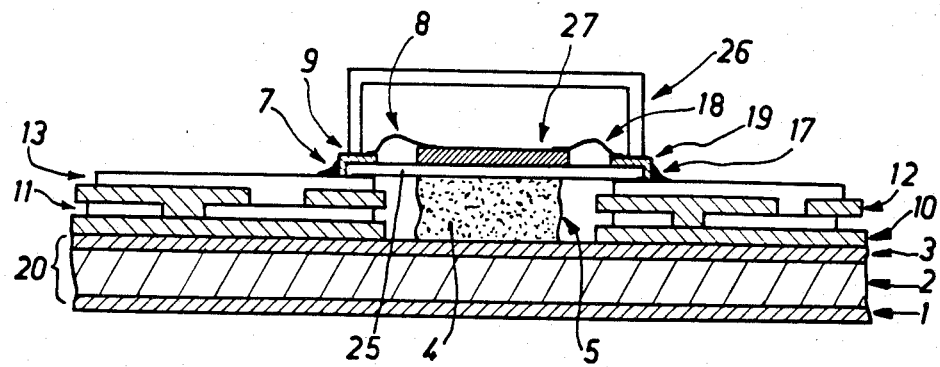
FIG. 2, FIG. 3 and FIG. 4 are each cross-sectional views of integrated circuit assemblies employing a laminated substrate and covered with an insulating layer formed of the dielectric composition of the invention.

FIG. 2 shows an assembly of the "chip carrier" type on a laminated substrate.

Figure 3:
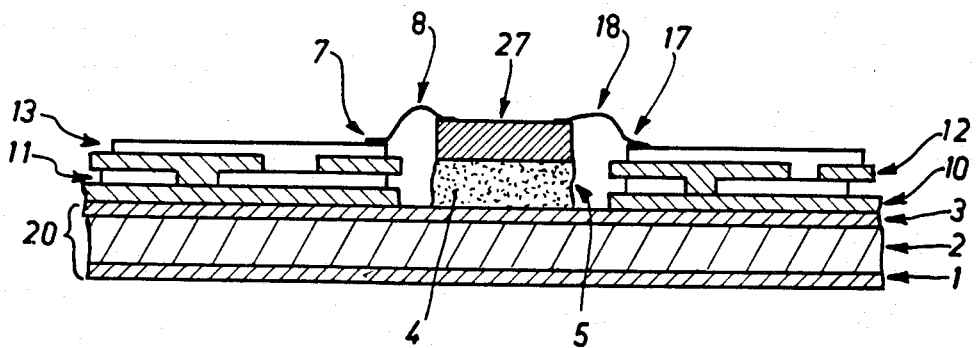

FIG. 3 shows an assembly of a circuit manufactured on semiconductor or semi-insulator on a laminated substrate.

Figure 4:
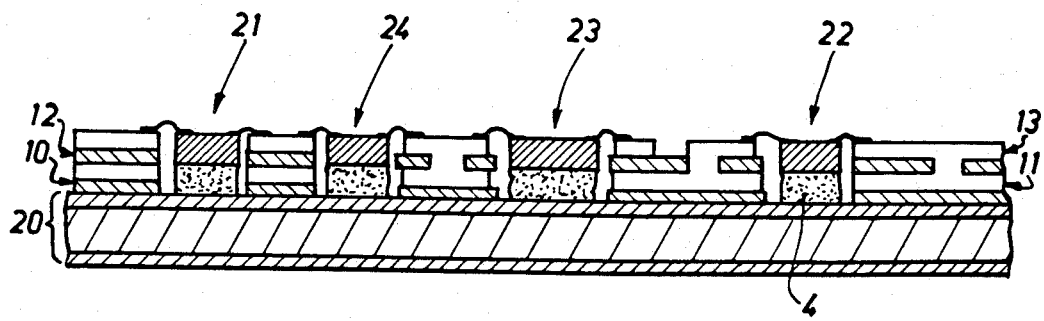

FIG. 4 shows an assembly of discrete elements on a laminated substrate.

As shown in FIG. 1 the relative elongation of alumina (curve 2) is very close to the relative elongation of the laminate of the type 16/68/16 between 0° and 300° C. (curve 1). Above this temperature range the relative elongation of the laminate in the directions parallel to its surface increases very rapidly. Hence an insulating silk-screening ink such as the ink described in U.S. Pat. No. 4,323,652 mentioned above the relative elongation of which follows that of alumina, would produce, on the deposition face of the laminate during cooling after firing, a shrinkage which would produce the appearance of a convex rear surface. On the contrary, the silk-screening ink produced according to the invention presents an average relative elongation near that of the colaminate up to the firing temperature at approximately 530° C. (curve 5 of FIG. 1). Hence, during cooling after firing no deformation at all is produced of the colaminated substrate.

The originality of the present invention hence resides in the fact of using as a ceramic phase a mixture of zinc oxide, cobalt oxide and lead oxide, the composition of the vitreous phase being hence slightly different from the vitreous phases known in the art.

Examples of the glass (vitreous compositions) used are recited in the following tables, the compositions A and B corresponding to two embodiments (Table I) and table II giving the ranges of the possible compositions.

TABLE I

| Vitreous phase: molar composition in % | | |
|---|---|---|
| | Example A | Example B (preferred) |
| ZnO | 20 | 20 |
| SiO$_2$ | 35 | 45 |
| B$_2$O$_3$ | 20 | 5 |
| Al$_2$O$_3$ | 10 | 5 |
| BaO | 15 | 25 |
| Starting mixture: composition in volume | | |
| Above vitreous phase | | 68% |
| Ceramic phases { ZnO | | 11% |
| Co$_3$O$_4$ | | 2% |
| PbO$_2$ | | 19% |
| | Example A | Example B |
| 10$^7$ α | 73 | 80 |
| ρ (kg · m$^{-3}$) | 3394 | 3187 |
| AP (°C.) | 615 | 550 |
| DSP (°C.) | 650 | 580 |

TABLE II

| Vitreous phase: molar composition in % | |
|---|---|
| ZnO | 15 to 30% |
| SiO$_2$ | 30 to 55% |
| B$_2$O$_3$ | 0 to 20% |
| Al$_2$O$_3$ | 0 to 10% |
| BaO | 15 to 40% |
| Starting mixture: composition in volume | |
| Above vitreous phase | 85 to 60% |
| Ceramic phases { ZnO | 5 to 20% |
| Co$_3$O$_4$ | 0 to 10% |
| PbO$_2$ | 10 to 25% |

In addition to the composition for two examples, Table I also recites the voluminal mass ρ in kilograms per m$^3$, the coefficient of expansion α×10$^7$ per °C. between 20° and 320° C., an annealing temperature in °C. (AP) and the dilatometric softening point (DSP) in °C.

For a good manufacture of a silk screening ink according to the present invention, first a glass of the vitreous phase is formed in the molar ratios corresponding to the ranges recited in Table II or in the specific ratios given as preferred ratios (example B, Table I).

The glass thus obtained is pulverised. During this operation there are incorporated the powders of zinc oxide (ZnO), of cobalt (Co$_3$O$_4$) and lead (PbO$_2$) in order to obtain a homogeneous mixture in the preferential volume ratios of 68% of glass, 11% of zinc oxide (ZnO), 2% of cobalt oxide (Co$_3$O$_4$) and 19% of lead dioxide (PbO$_2$).

This pulverisation may be effected in a liquid medium, for example water. The result of the pulverisation is then dried and dispersed in an organic carrier.

In so far as organic carrier is suitable to make said starting mixture suitable for silk-screening, a solution may be used containing a polymer, for example a solution of ethyl cellulose in a terpineol, or a mixture based on terpineol. Before firing the organic carrier may form 10 to 40% by weight of silk screening ink. The ratios of the organic carrier with respect to the ink are chosen as a function of the desired rheological behaviour.

The organic carrier must be removed during firing. In order to avoid oxidation of the copper surfaces of the laminate, the ink prepared and deposited on the substrate is subjected to firing under nitrogen. The organic carrier during such a firing can be destroyed only due to the oxygen supplied by the oxides of the ceramic phases and in particular Co$_3$O$_4$.

Hence, with the object of applying oxygen, it is essential for the supply of organic carrier that the lead be introduced in the form of dioxide (PbO$_2$) in the ceramic phases.

Lead oxide (PbO) acts to permit the adjustment of the coefficient of expansion of the ink according to the values chosen.

However, this lead oxide (PbO) could not be introduced directly in the vitreous phase for in this case the quantity of oxygen supplied by the ceramic phase Co$_3$O$_4$ would be insufficient. It would thus be necessary to adjust the ratios of the ceramic phases, and the adjustment of the coefficient of expansion to the desired values would not be obtained any more.

On the contrary, by introducing the lead in the form of the dioxide (PbO$_2$) in the ceramic phases, the quantities of oxygen used are sufficient to destroy the organic carrier during firing and the resulting lead oxide (PbO) at that moment enters into the vitreous phase permitting the adjustment of the desired coefficient of expansion.

Finally, the composition according to the invention has an additional advantage. The vitreous phase is spontaneously devitrifiable due to its behaviour with zinc oxide. Said devitrification increases the melting point of the layer by the formation of a dispersed crystalline phase which is less fusible. Said property avoids a spreading out of the insulating layer during firing of the conductive layer deposited afterwards on its surface. On the other hand the zinc oxide constituting one of the ceramic phases will reinforce said effect for it becomes a devitrifying agent after dissolution in the vitreous phase.

Various examples of devices of using the ink manufactured according to the invention are possible.

A first such example is shown in FIG. 2. As shown in this figure, the device comprises a laminated substrate 20 composed of two copper layers 1 and 3 adhering respectively to each face of a plate of Invar 2. On the upper layer 3 there is deposited an insulating silk screening layer 10 of the invention according to a pattern which provides apertures to permit the connection of the rear side 25 of the casing 25, 26 to the substrate 20. This may be, for example, an aperture 5 slightly below the surface of a casing or chip carrier 25, 26, destined to be fixed to the substrate afterwards. On the insulating layer 10 are then deposited a series of layers which are alternately conductive and insulating and are formed by means by use of of silk screening ink of high temperature, using a pattern providing to constitute the connection circuit of the chip carrier with the output blocks of the device which are implanted on the insulating layer 10 at the periphery of the laminated substrate 20. The first layer formed on the insulating layer 10 may be a conductive layer 11 of the type described in GB-Pat. No. 1,489,031. The following layer may be an insulating layer 12 which must then imperatively be of the type described in the present invention for reasons of adapting to the conductive layer on the one hand and to the coefficient of expansion of the substrate of the other hand, which reasons have already been explained hereinbefore. In this manner, up to five conductive layers of the type 11 may be realized separated by insulating layers according to the invention. FIG. 2 thus shows the insulating layers 10, 12 separating the conductive layers 11, 13. A soldering paste of tin-lead (Sn-Pb 60-40) 4 which can be silk-screened may then be deposited in the aperture 5 provided to receive the chip carrier 25, 26. The chip carrier 25, 26 will then be fixed in the location provided by refusion of said layer. The chip carrier itself contains a microcircuit 27 manufactured on silicon or gallium arsenide the outputs of which are made by the wires 8 and 18 connected to the output blocks 9 and 19 of the chip carrier. These blocks themselves are connected to the conductive layers of the type of the layer 11 or 13 by the soldered joints 7 and 17, The chip carrier is always provided on a conductive layer.

FIG. 3 shows a second embodiment of device employing the ink of the invention. In this example the microcircuit 27 is directly fixed on the colaminated substrate 20 either by means of a fusible silk-screening glass or by gluing or by means of a gold-silicon alloy (Au-Si) 4, after the manufacture on the colaminate of a hybrid circuit having peripheral connections constituted by a series of alternately insulating and conductive layers of the type of the layers 10 and 11 described hereinbefore.

FIG. 4 shows a third embodiment of a device employing the ink of the invention. In this example the laminate 20 protected by the insulating layer 10 according to the invention receives active elements such as diodes 21 and transistors 22 and passive elements such as the resistor 23, capacitor 24 and inductors all the interconnections of which are made by means of silk-screening ink of the type of the layers 10 and 11 described hereinbefore. The discrete elements may be connected by means of layers 4 of fusible silk-screening glass or an alloy of gold-silicon (Au-Si) as described above. The active elements may be manufactured on semiconductor substrates, silicon (Si) for example, or semi-insulating substrates, for example, gallium arsenide (GaAs). The passive elements may be manufactured on alumina.

As shown in FIG. 1, the curves of relative elongation of silicon (curve 3), of alumina (curve 2), of gallium arsenide (curve 4) teach that the fixation of said materials is perfectly compatible with the laminated substrate the relative elongation of which is shown by curve 1, this up to approximately 200° C. for silicon and approximately 300° C. for gallium arsenide and alumina.

By directly fixing the components, microcircuits or discrete elements on the colaminate as shown in the second and third examples, the improved conditions for the cooling of said components may be used to advantage.

In each of the three described examples the method of manufacturing comprises the steps of:

1. Depositing the insulating layer according to the invention by silk-screening through a screen according to a chosen pattern and firing said layer.
2. Depositing a conductive layer, for example such as described in GB Pat. No. 1,489,031 through a silk-screening screen according to a chosen pattern and firing said layer.
3. Repetition of the steps 1 and 2 until the circuit described is obtained.
4. Fixing the elements chip-carrier, microcircuits or discrete elements by means of suitable silk-screening soldering pastes.
5. Optionally locally protecting the insulated elements, other than the chip-carrier, by encapsulation. At this level such an encapsulation may be made without any problems by a drop of polymer 3 since it relates to a simple protection and not a part of the circuit which must present a certain rigidity.

It is to be noted that circuits thus manufactured have shown for the insulating layer according to the invention a dielectric constant $\epsilon_r = 12$ measured at 1 MHz, dielectric losses lower than $3 \times 10^{-2}$ and a resistance to the upper insulation at $10^{11} \Omega$ for a capacitor of $5 \times 5$ mm$^2$.

It will be obvious that numerous variations are possible within the composition ranges given or in the form of manufacturing the circuits using said insulating composition, or in the equivalent substituents without therefor departing from the scope of the present invention.

I claim:

1. A starting mixture suitable for forming a dielectric composition consisting essentially of 85%–60% by volume of a vitreous phase and 15%–40% by volume of ceramic phases, said vitreous phase having the following composition by mol.%:
   30–55% $SiO_2$, 15–30% ZnO, 15–40% BaO, 0–20% $B_2O_3$ and 0–10% $Al_2O_3$ and said ceramic phases consisting essentially in volume percent of:
   ZnO-5–20%, $Co_3O_4$-0–10% and $PbO_2$-10–25%.

2. A starting mixture as claimed in claim 1, characterized in that the molar ratios of the vitreous phase are chosen to be equal to 45% of silicon ($SiO_2$), 20% of zinc oxide (ZnO), 5% of boric anhydride ($B_2O_3$), 5% of alumina ($Al_2O_3$) and 25% of oxide (BaO).

3. A starting mixture as claimed in claim 1, characterized in that it consists essentially of 68% by volume of the vitreous phase, a ceramic phase of zinc oxide (ZnO) in 11% by volume, a ceramic phase of cobalt oxide ($Co_3O_4$) in 2% by volume and a ceramic phase of lead dioxide ($PbO_2$) in 19% by volume.

4. A starting mixture as claimed in claim 2, characterized in that it consists essentially of the vitreous phase in 68% by volume, a ceramic phase of zinc oxide (ZnO) in 11% by volume, a ceramic phase of cobalt oxide ($Co_3O_4$) in 2% by volume and a ceramic phase of lead dioxide ($PbO_2$) in 19% by volume.

* * * * *